(12) United States Patent
Takahashi

(10) Patent No.: US 8,044,306 B2
(45) Date of Patent: Oct. 25, 2011

(54) WIRING BOARD AND METHOD OF MANUFACTURING THE SAME

(75) Inventor: Michimasa Takahashi, Gifu (JP)

(73) Assignee: Ibiden Co., Ltd., Ogaki-shi (JP)

( * ) Notice: Subject to any disclaimer, the term of this patent is extended or adjusted under 35 U.S.C. 154(b) by 732 days.

(21) Appl. No.: 12/111,256

(22) Filed: Apr. 29, 2008

(65) Prior Publication Data

US 2009/0014207 A1   Jan. 15, 2009

Related U.S. Application Data

(60) Provisional application No. 60/949,102, filed on Jul. 11, 2007.

(51) Int. Cl.
H05K 1/11 (2006.01)

(52) U.S. Cl. ......... 174/266; 174/262; 174/265; 361/795

(58) Field of Classification Search .......... 174/260–266, 174/255; 361/790, 792–795, 728, 729, 735, 361/748–751
See application file for complete search history.

(56) References Cited

U.S. PATENT DOCUMENTS

| | | | |
|---|---|---|---|
| 6,207,595 B1 | 3/2001 | Appelt et al. | |
| 7,726,016 B2* | 6/2010 | Ohsumi et al. | 29/852 |
| 2001/0027842 A1 | 10/2001 | Curcio et al. | |
| 2002/0062990 A1* | 5/2002 | Kikuchi et al. | 174/264 |
| 2002/0108776 A1* | 8/2002 | Uchikawa et al. | 174/255 |
| 2004/0025333 A1 | 2/2004 | Hirose et al. | |
| 2005/0280130 A1* | 12/2005 | Nakai | 257/678 |
| 2006/0231290 A1* | 10/2006 | Kariya et al. | 174/258 |
| 2007/0010065 A1 | 1/2007 | Das et al. | |
| 2007/0124926 A1* | 6/2007 | Ishimaru et al. | 29/830 |

FOREIGN PATENT DOCUMENTS

| | | |
|---|---|---|
| EP | 1 117 283 A1 | 7/2001 |
| JP | 04-309284 | 10/1992 |
| JP | 05-129779 | 5/1993 |
| JP | 07-314607 | 12/1995 |
| JP | 10-303556 | 11/1998 |
| JP | 2000-49458 | 2/2000 |
| JP | 2000-349418 | 12/2000 |
| JP | 2001-257474 | 9/2001 |
| JP | 2002-151815 | 5/2002 |
| JP | 2002-246760 | 8/2002 |
| JP | 2003-124632 | 4/2003 |

OTHER PUBLICATIONS

European Search Report issued Jun. 20, 2011 in EP 07790573.5.

* cited by examiner

*Primary Examiner* — Hoa C Nguyen
(74) *Attorney, Agent, or Firm* — Oblon, Spivak, McClelland, Maier & Neustadt, L.L.P.

(57) ABSTRACT

A wiring board has a base substrate, a conductive pattern formed on the base substrate, an insulation layer formed on the conductive pattern and the base substrate and including a resin-impregnated inorganic cloth, a conductive pattern formed on the insulating layer, a via formed in the insulation layer and connecting the conductive pattern formed on the base substrate and the conductive pattern formed on the insulating layer, and a through-hole connected to the conductive pattern formed on the base substrate, penetrating through the base substrate and having a hole diameter in a range of 10 μm to 150 μm.

29 Claims, 13 Drawing Sheets

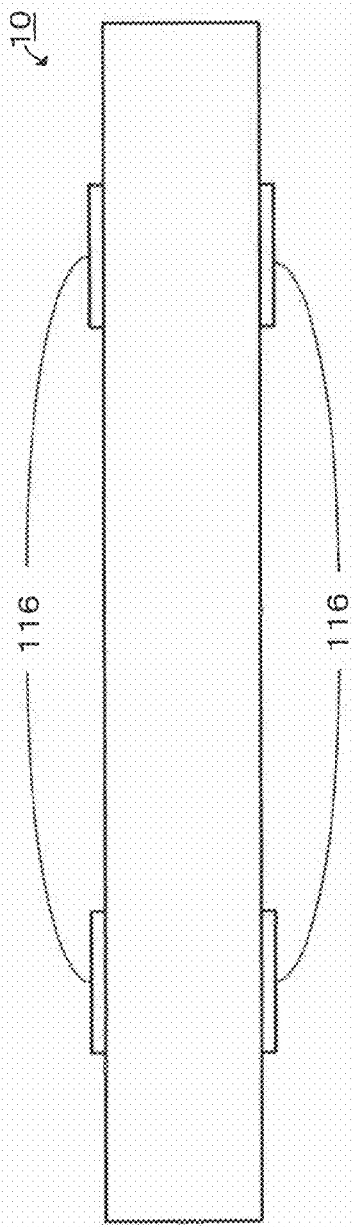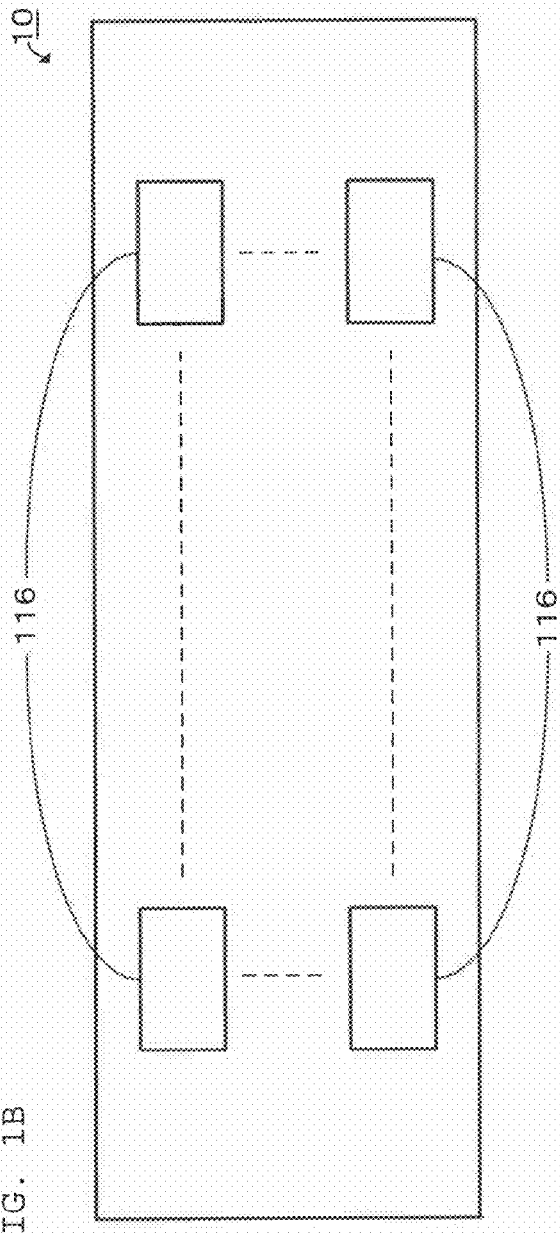

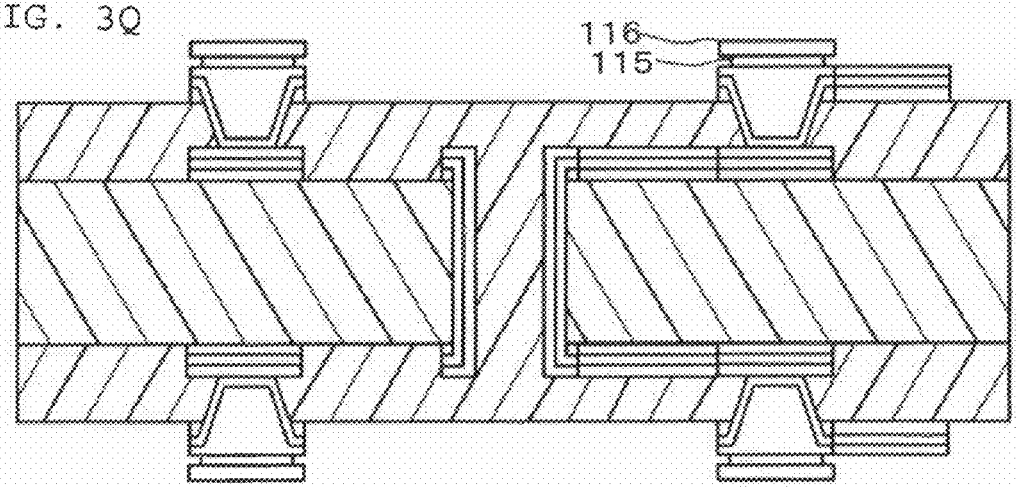

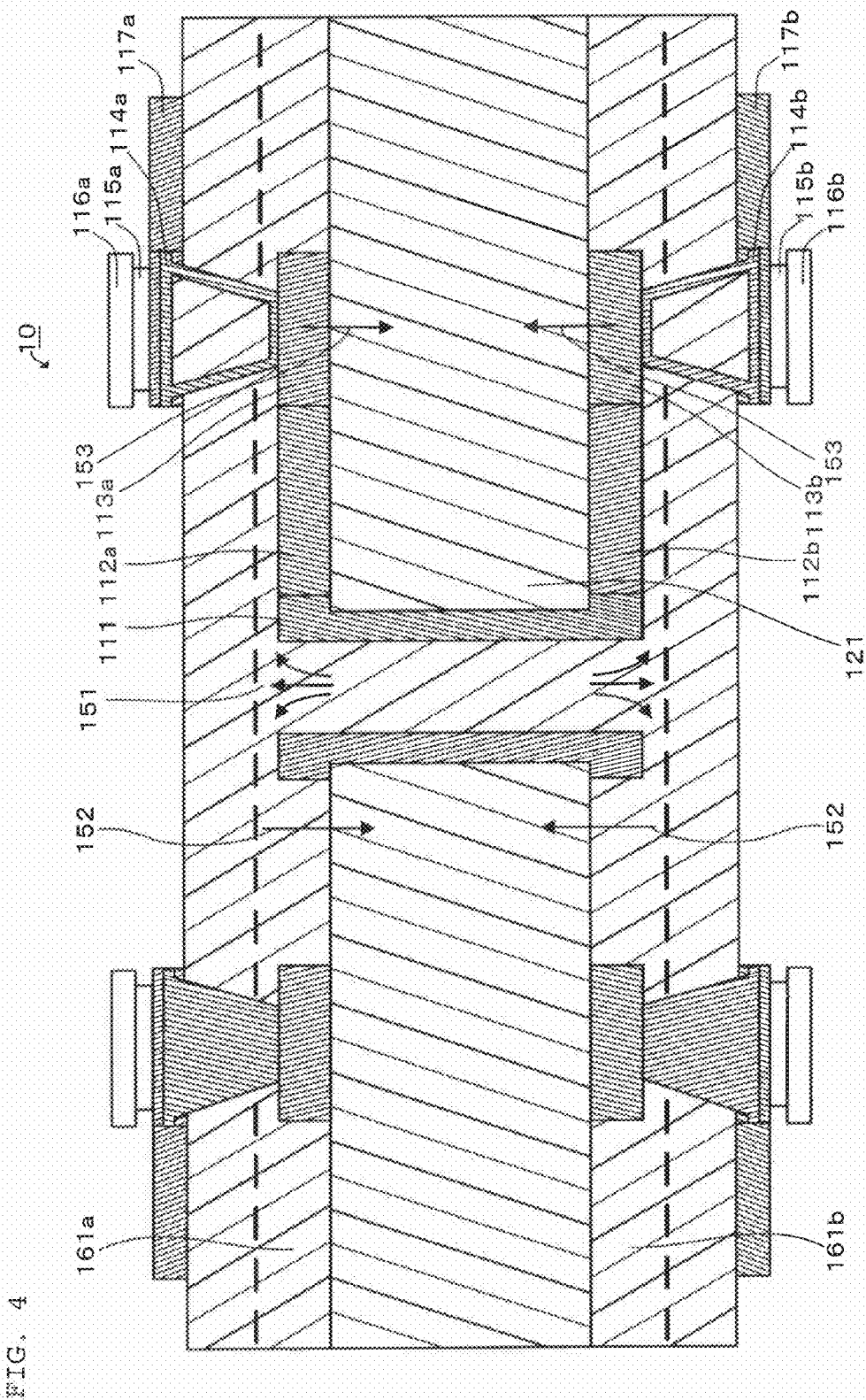

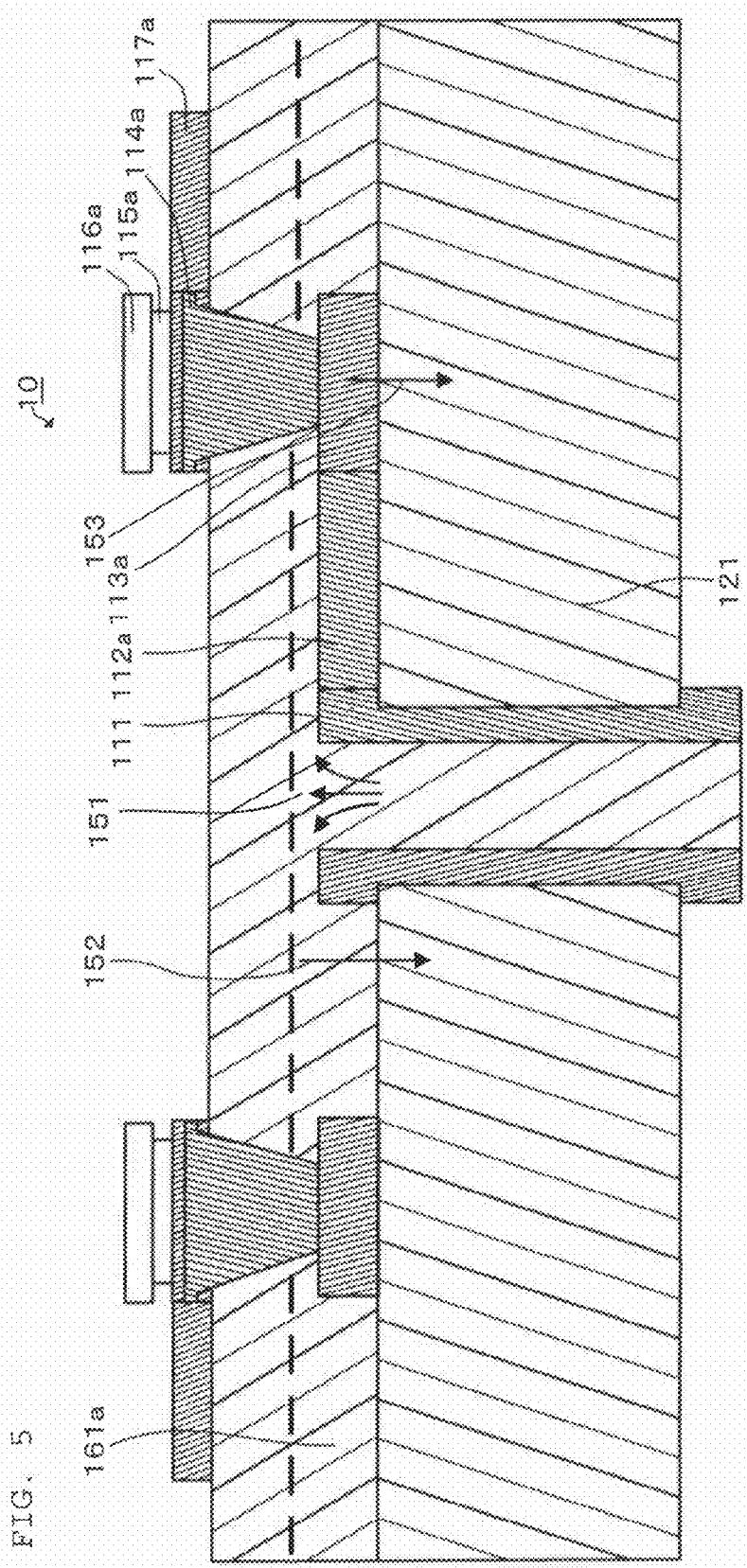

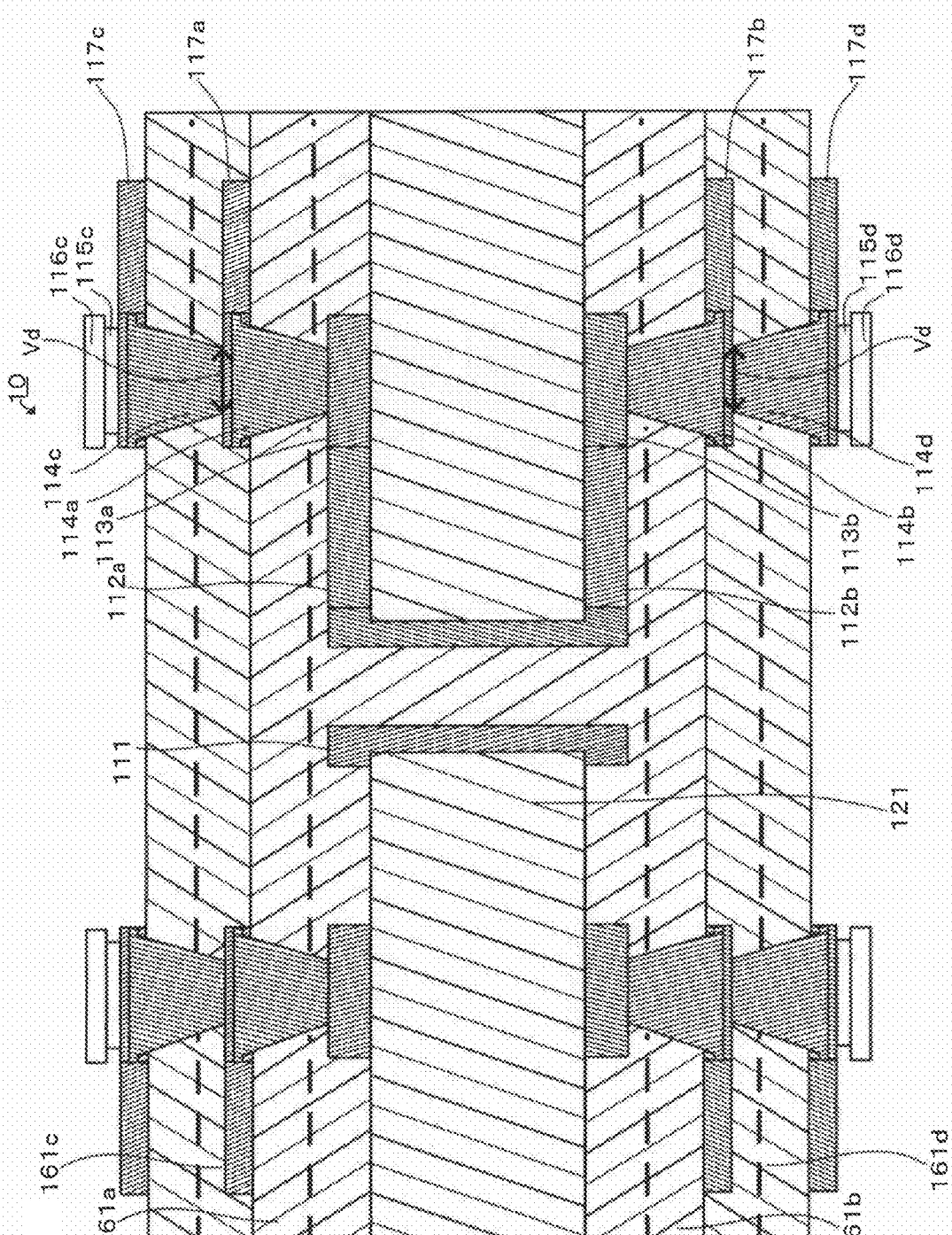

WIRING BOARD AND METHOD OF MANUFACTURING THE SAME

CROSS-REFERENCE TO RELATED APPLICATIONS

The present application claims the benefits of priority to U.S. Applications No. 60/949,102, filed Jul. 11, 2007. The contents of that application are incorporated herein by reference in their entirety.

BACKGROUND OF THE INVENTION

1. Field of the Invention

The present invention relates to a rigid wiring board with interlayer connection and a method of manufacturing the same.

2. Discussion of the Background

In a wiring board with mounted multiple electronic components used in a cell phone or the like, connection reliability between conductive patterns is required.

However, while an electronic device is in use for a long duration, electronic components inside the electronic device may generate heat. And if the heat from the electronic components is transmitted to the resin filled in a through-hole, the resin filled in the through-hole expands and the insulation layers at the top and bottom portions of the through-hole are pushed up. In such a case, if a conductive pattern is formed either on the top or the bottom portion of the through-hole, since the insulation layer is pushed up, the conductive pattern may warp and the connection between conductive patterns may rupture. Also, by the expansion of the resin filled in the through-hole, the plating in the through-hole may be damaged and the connection between conductive patterns connected via the through-hole may rupture.

Japanese Patent Application No. 2005-199442 describes that through-holes connecting conductive patterns are formed so as to slightly curve outward at the center portion. The contents of that reference are incorporated herein by reference in their entirety.

SUMMARY OF THE INVENTION

According to one aspect of the present invention, a wiring board has a base substrate, a conductive pattern formed on the base substrate, an insulation layer formed on the conductive pattern and the base substrate and including a resin-impregnated inorganic cloth, a conductive pattern formed on the insulating layer, a via formed in the insulation layer and connecting the conductive pattern formed on the base substrate and the conductive pattern formed on the insulating layer, and a through-hole connected to the conductive pattern formed on the base substrate, penetrating through the base substrate and having a hole diameter in a range of 10 μm to 150 μm.

According to another aspect of the present invention, a wiring board has a base substrate having a conductive pattern formed on an upper surface of the base substrate and a conductive pattern formed on a lower surface of the base substrate, a first upper-layer insulation layer formed on the upper surface of the base substrate and the conductive pattern formed on the upper surface of the base substrate, the first upper-layer insulation layer having a conductive pattern formed thereon and including a resin-impregnated inorganic cloth, a first lower-layer insulation layer formed on the lower surface of the base substrate and the conductive pattern formed on the lower surface of the base substrate, the first lower-layer insulation layer having a conductive pattern formed thereon and including a resin-impregnated inorganic cloth, a via formed in the first upper-layer insulation layer and connecting the conductive pattern formed on the upper surface of the base substrate and the conductive pattern formed on the first upper-layer insulation layer, a via formed in the first lower-layer insulation layer and connecting the conductive pattern formed on the lower surface of the base substrate and the conductive pattern formed underneath the first lower-layer insulation layer, and a through-hole connected to the conductive pattern formed on the upper surface of the base substrate and the conductive pattern formed on the lower surface of the base substrate, penetrating through the base substrate and having a hole-diameter in a range of 10 μm to 150 μm.

According to yet another aspect of the present invention, a method of manufacturing a wiring board includes providing in a base substrate having a conductive pattern on a surface of the base substrate, forming a through-hole penetrating through the base substrate, connected to the conductive pattern on the surface of the base substrate, and having a hole-diameter in a range of 10 μm to 150 μm, laminating on the base substrate an insulation layer including a resin-impregnated inorganic cloth and having a conductive pattern on a surface of the insulation layer, and forming in the insulation layer a via connecting the conductive pattern formed on the surface of the insulation layer and the conductive pattern formed on the surface of the base substrate.

According to still another aspect of the present invention, a method of manufacturing a wiring board including providing a base substrate having a conductive pattern on an upper surface of the base substrate and a conductive pattern on a lower surface of the base substrate, forming a through-hole penetrating through the base substrate, connected to the conductive pattern on the upper surface of the base substrate and the conductive pattern on the lower surface of the base substrate, and having a hole-diameter in a range of 10 μm to 150 μm, laminating on the upper surface of the base substrate a first upper-layer insulation layer including a resin-impregnated inorganic cloth and having a conductive pattern on a surface of the first insulation layer, laminating on the lower surface of the base substrate a first lower-layer insulation layer including a resin-impregnated inorganic cloth and having a conductive pattern on a surface of the first lower-layer insulation layer, forming in the first upper-layer insulation layer a via connecting the conductive pattern formed on the first upper-layer insulation layer and the conductive pattern formed on the upper surface of the base substrate, and forming in the first lower-layer insulation layer a via that connecting the conductive pattern formed underneath the first lower-layer insulation layer and the conductive pattern formed on the lower surface of the base substrate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1A is a side view of a wiring board according to an embodiment of the present invention;

FIG. 1B is a plan view of the wiring board shown in FIG. 1A;

FIG. 4 is a cross-sectional view of a wiring board according to an embodiment of the present invention.

FIG. 5 is a cross-sectional view of a wiring board according to an embodiment of the present invention.

FIG. 6 is a cross-sectional view of a wiring board according to an embodiment of the present invention.

DESCRIPTION OF THE EMBODIMENTS

Figure 2:
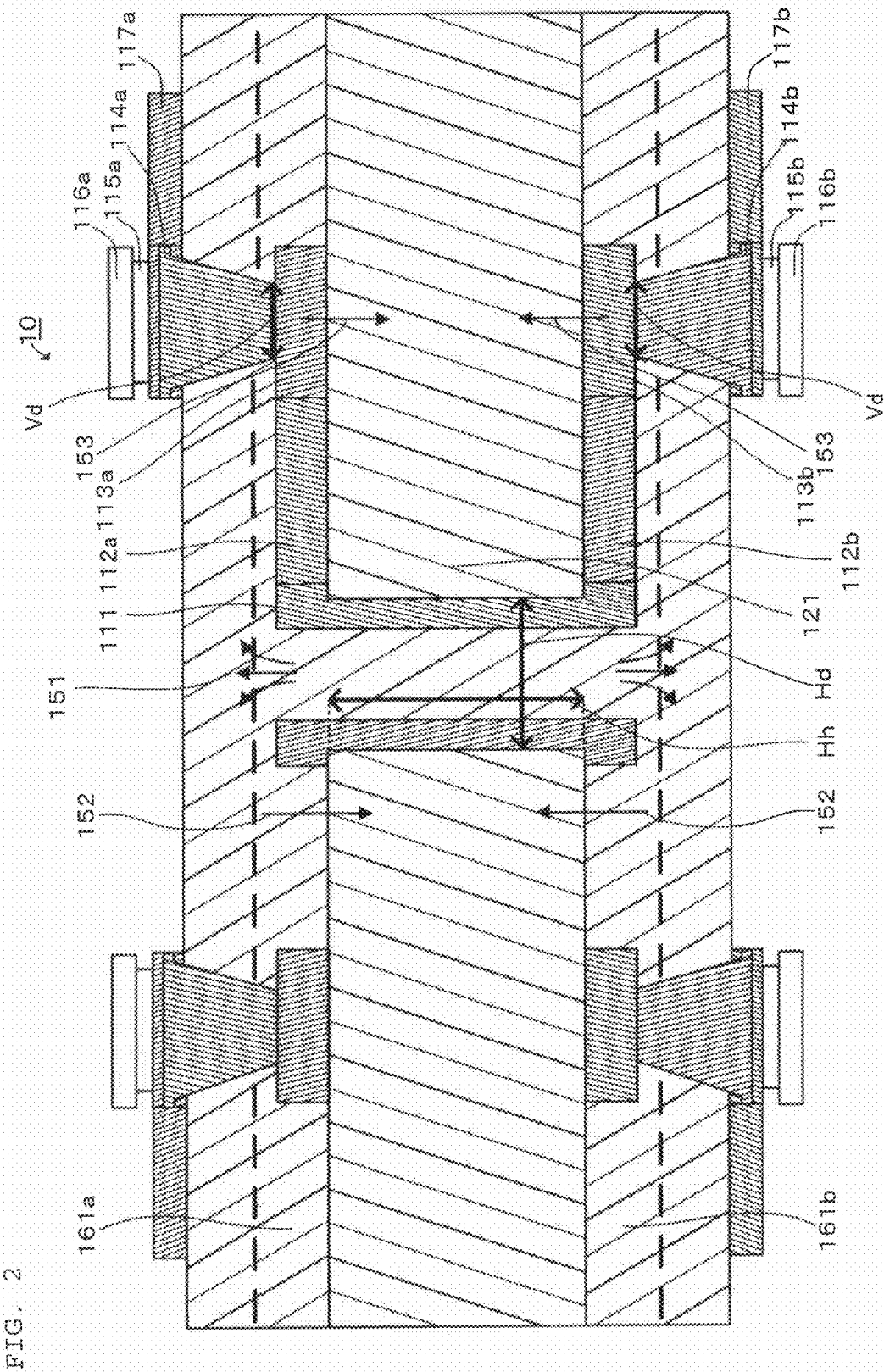
FIG. 2 is a cross-sectional view of a wiring board according to an embodiment of the present invention.

The embodiments will now be described with reference to the accompanying drawings, wherein like reference numerals designate corresponding or identical elements throughout the various drawings.

As shown in FIGS. 1A and 1B, wiring board 10 according to an embodiment of the present invention has a form of a rectangular shape with a thickness of approximately 2 mm. On the upper mounting surface and the lower mounting surface of wiring board 10, multiple electronic chips 116 are mounted respectively.

Referring to FIG. 2, a detailed structure of wiring board 10 having the above overall structure is described. Wiring board 10 is structured by laminating first upper-layer insulation layer (161a), base substrate 121 and first lower-layer insulation layer (161b). First upper-layer insulation layer (161a), first lower-layer insulation layer (161b) and base substrate 121 have rectangular shapes, each having the same width and length.

Base substrate 121 is made of a highly rigid material such as glass-epoxy resin. The thickness of base substrate 121 is made 50 to 100 μm, preferably about 100 μm. First upper-layer insulation layer (161a) and first lower-layer insulation layer (161b) are also made of glass-epoxy resin. The thickness of first upper-layer insulation layer (161a) and first lower-layer insulation layer (161b) is approximately 10 μm to 20 μm. First upper-layer insulation layer (161a) and first lower-layer insulation layer (161b) contain a layer of glass-cloth inorganic fabric. The thickness of the glass cloth is 20 μm and the thickness of the glass fiber forming the glass cloth is 5.0 μm.

On the upper surface of first upper-layer insulation layer (161a) and the lower surface of first lower-layer insulation layer (161b), conductive pattern (117a, 117b) are formed respectively. On the upper surface of base substrate 121, conductive patterns (112a, 113a) are formed, and on the lower surface of base substrate 121, conductive patterns (112b, 113b) are also formed. Each conductive pattern (117a, 117b, 112a, 112b, 113a, 113b) electrically connects required portions in the circuit substrate.

On via (114a), electronic chip (116a) is placed through connection pad (115a). Electronic chip (116a) and conductive pattern (113a) are electrically connected through via (114a). The interior of via (114a) is filled with plated metal. The plated metal is copper. As shown in FIG. 4, the interior of vias (114a, 114b) may be filled with resin such as epoxy resin.

Via diameters (Vd) of vias (114a, 114b) are in the range of 10 μm to 50 μm; more preferably, in the range of 20 μm to 40 μm. If the via diameter is larger than 50 μm, vias become unsuitable for actualizing a fine wiring structure; and if the via diameter is smaller than 10 μm, connection reliability becomes unstable. In this embodiment, the hole-diameter of vias (114a, 114b) in wiring board 10 is made 40 μm.

Through-hole 111 penetrates base substrate 121. Through-hole 111 electrically connects conductive pattern (112a) on the upper surface of base substrate 121 and conductive pattern (112b) on the lower surface of base substrate 121. Therefore, electronic chip (116a) is electrically connected to electronic chip (116b) through conductive pattern (117a), via (114a), conductive pattern (113a), conductive pattern (112a), through-hole 111, conductive pattern (112b), conductive pattern (113b), via (114b) and conductive pattern (117b). The inner surface of through-hole 111 is metal plated, electrically connecting conductive patterns. The metal to plate the inner surface of through-hole 111 is copper. The interior of plated through-hole 111 is filled with resin such as epoxy resin.

The hole-diameter (Hd) of through-hole 111 is in the range of 10 μm to 150 μm; more preferably, in the range of 50 μm to 100 μm. If the hole-diameter is larger than 150 μm, the resin content inside the through-hole is large and if electrical continuity inside the through-hole generates high temperatures, the resin inside the through-hole expands. Accordingly, the insulation layers on the top and bottom portions of the through-hole are pushed up, and the connection between conductive patterns may rupture. Also, if the hole-diameter is smaller than 10 μm, forming fine hole-diameters becomes difficult. As a result, the productivity of manufacturing wiring boards may be lowered and the connection reliability of electrical continuity via through-holes may also be unstable. In this embodiment, the hole-diameter (Hd) of through-hole 111 in wiring board 10 is made 150 μm.

The aspect ratio (a ratio of hole-height (Hh) and hole-diameter (Hd), i.e., Hh/Hd) of through-hole 111 is between two (2) and five (5), more preferably between three (3) and four (4). If the aspect ratio is larger than five (5), forming holes with minute diameters becomes difficult, and the productivity of wiring boards may become lowered. Also, if the aspect ratio is smaller than two (2), the resin content inside the through-hole becomes large, and if electrical continuity inside the through-hole generates high temperatures, the resin inside the through-hole expands. Accordingly, the insulation layers on the top and bottom portions of the through-hole are pushed up, and the connection between the conductive patterns may rupture.

Wiring board 10 having the above structure can conduct varieties of signal transmission such as transmitting electrical signals from electronic chip (116a) mounted on first upper-layer insulation layer (161a) to electronic chip (116b) mounted beneath first lower-layer insulation layer 161.

Also, by setting the hole-diameter of the through-hole in the range of 10 μm to 150 μm, the resin content inside the through-hole is appropriately suppressed. Accordingly, if the electrical continuity inside the through-hole generates high temperatures and the resin inside the through-hole expands, the force (indicated as arrows 151 in FIG. 2) to push up the insulation layers on the top and bottom portions of the through-hole is suppressed, and thus the risk of rupture in the connection between conductive patterns may be minimized.

And, on base substrate 121, insulation layers made with base material of resin-impregnated inorganic cloth are laminated. The insulation layer made with base material of resin-impregnated inorganic cloth has rigidity and strong shape retention. Therefore, even if electrical continuity inside the through-hole generates high temperatures and the resin inside the through-hole expands, thus causing the insulation layers on the top and bottom portions of the through-hole to be pushed up, since the insulation layers have strong shape retention, the resin expansion may be suppressed as shown with arrows 152 in FIG. 2.

Moreover, vias (114*a*) formed in first upper-layer insulation layer (161*a*) physically join first upper-layer insulation layer (161*a*) and base substrate 121 through conductive pattern (113*a*). Therefore, even if electrical continuity inside the through-hole generates high temperatures and the resin inside the through-hole expands, since the insulation layer and the base substrate are physically joined, the force to push up the insulation layers on the top and bottom portions of the through-hole may be countered. Since vias (114*a*) work as if they are anchors when securing insulation layer (161*a*) to base substrate 121, this effect is hereinafter referred to as an "anchoring effect." If the via diameter is smaller than 10 µm, the force to physically join the insulation layer and the base substrate weakens, and it is difficult to expect an anchoring effect. Therefore, as described above, the via-diameter is preferred to be made 10 µm or larger.

Also, by containing a layer of glass cloth in each insulation layer (161*a*, 161*b*), an increase in thickness of the insulation layer is prevented, and if an impact from being dropped is exerted on the wiring board, the insulation layers may absorb the impact. If multiple layers of glass cloth are contained in an insulation layer, the thickness of the insulation layer increases, and the resin content in the insulation layer is lowered, making it difficult to absorb the impact from being dropped.

A method of manufacturing wiring board 10 according to an embodiment of the present invention is described as follows.

Figure 3A:
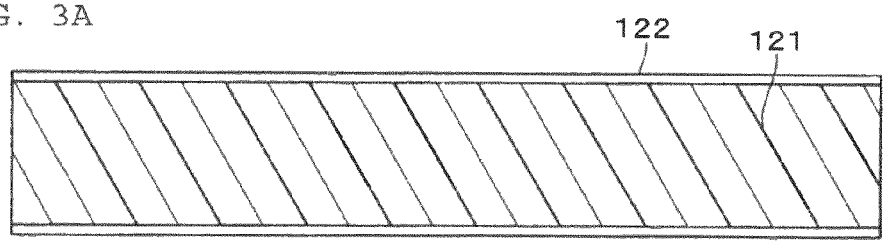
FIGS. 3A to 3Q are illustrations of steps showing a method to manufacture a wiring board according to an embodiment of the present invention.

First, as shown in FIG. 3A, a double-sided copper-clad laminate is prepared. The double-sided copper-clad laminate is base substrate 121 with laminated copper foil 122 on both surfaces.

Figure 3B:
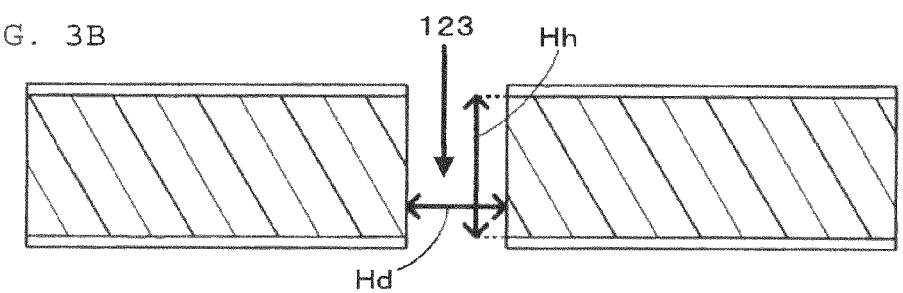

Next, as shown in FIG. 3B, in the double-sided copper-clad laminate, an opening for a through-hole is bored by a drilling process as shown by arrow 123. The diameter of the opening is set in the range of 10 µm to 150 µm. In this embodiment, the opening is 100 µm. Also, the opening may be bored by a laser. A $CO_2$ laser beamed from $CO_2$ laser processing apparatus may be used. Other than a $CO_2$ laser, a UV laser or an excimer laser may be used. However, a $CO_2$ laser is preferred, since it is quick in processing and low in production cost.

Figure 3C:
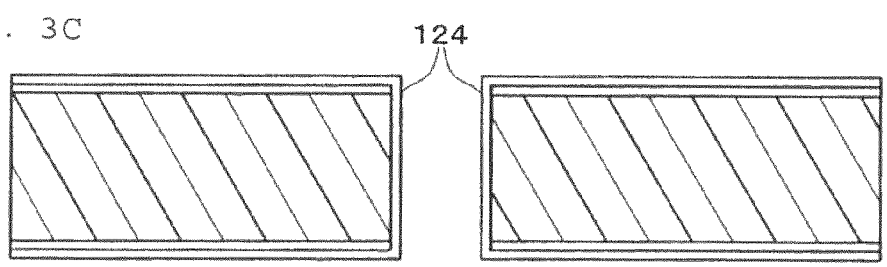

Next, as shown in FIG. 3C, on the double-sided copper-clad laminate with an opening, electroless copper plating 124 is performed. Before performing electroless copper plating on the opening bored in reference to FIG. 3B, a platinum catalyst is applied to facilitate the reaction in electroless copper plating. The electroless copper plating is performed as follows: in an electroless copper plating solution containing EDTA 150 g/liter, copper sulfate 20 g/liter, HCHO 30 ml/liter, NaOH 40 g/liter, α,α'-bipyridyl 80 g/liter, and polyethelene glycol 0.1 g/liter, the double-sided copper-clad laminate with an opening is immersed to form 0.5 µm-thick electroless copper plating film 124 on the entire surface. The electroless plating solution is set at 60° C. and the immersion time is set for approximately 30 minutes.

Figure 3D:
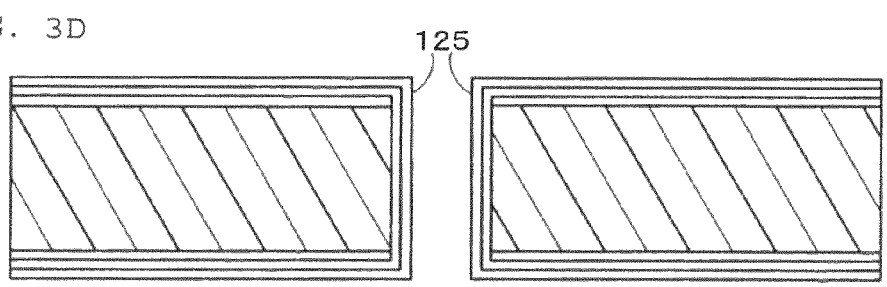

Next, as shown in FIG. 3D, by performing electrolytic copper plating, 14 µm-thick electrolytic copper plating 125 is formed. An electrolytic plating solution, containing sulfuric acid 180 g/liter, copper sulfate 80 g/liter and additive (Cupracid GL made by Atotech Japan) 1 ml/liter, is used. Conditions for electrolytic plating are current density of 1 $A/dm^2$ and electrolytic copper plating time of approximately 30 minutes.

Following the electrolytic copper plating, resin material is poured into the through-hole. For the resin material, for example, a solvent-type epoxy-resin may be used. The resin material is heated. The heating is conducted for an hour and the temperature is set, for example, at 170° C. Accordingly, the resin material is cured. Resin material that has overflowed from the through-hole is removed by buff-polishing.

Figure 3E:
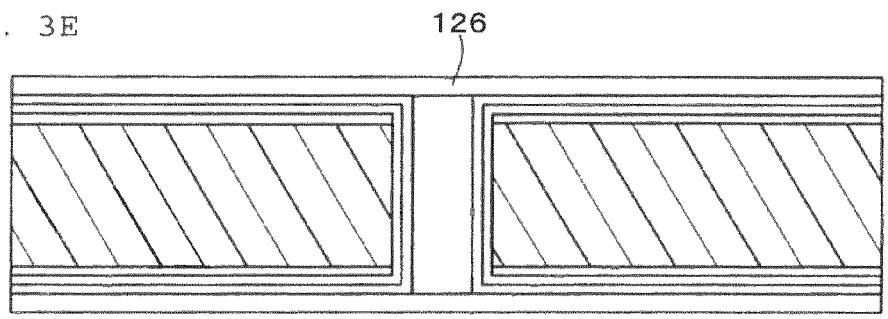

Next, as shown in FIG. 3E, mask resist 126 is laminated. For the mask resist, a commercially available dry film, for example, "H9040" made by Hitachi Chemical, is used.

Figure 3F:
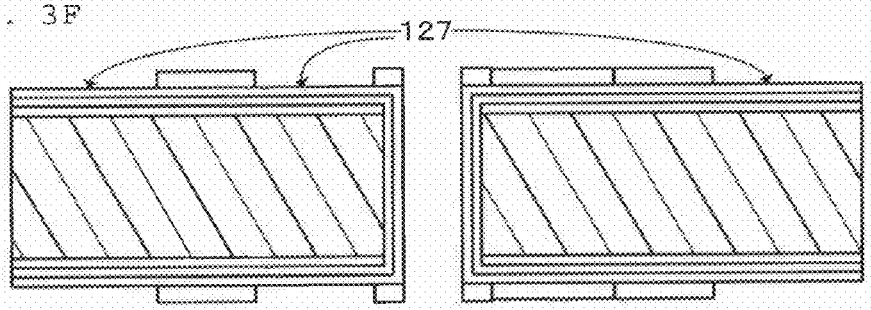

Next, as shown in FIG. 3F, at the predetermined portions indicated by arrows 127, the mask resist is exposed to light and developed using a 0.8%-sodium carbonate solution.

Figure 3G:
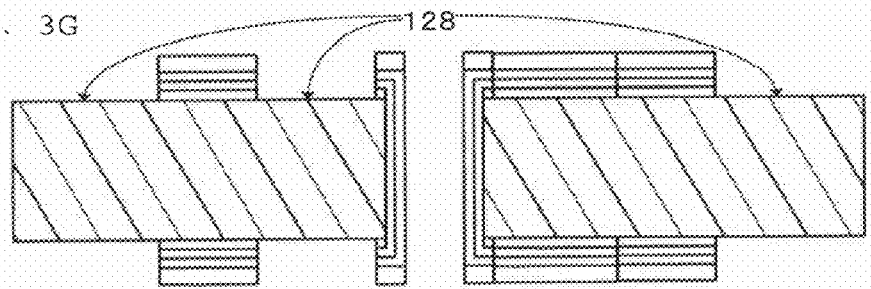

Next, as shown in FIG. 3G, the predetermined portions indicated by arrows 128 are etched using a copper (II) chloride solution. For the etching solution, it is not limited to a copper (II) chloride solution, but a persulfate solution such as sulfuric acid-hydrogen peroxide, ammonium persulfate, sodium persulfate or potassium persulfate, or an iron (II) chloride solution may be used.

Figure 3H:
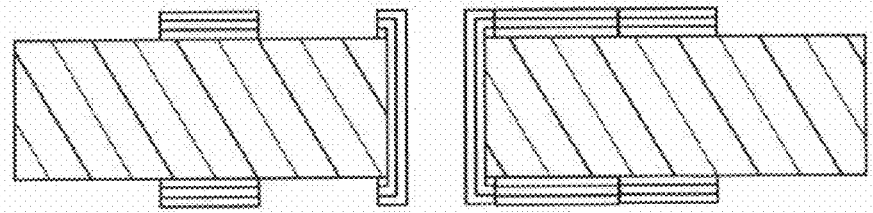

Then, as shown in FIG. 3H, the mask resist is removed using a 5%-potassium hydroxide solution.

Figure 3I:
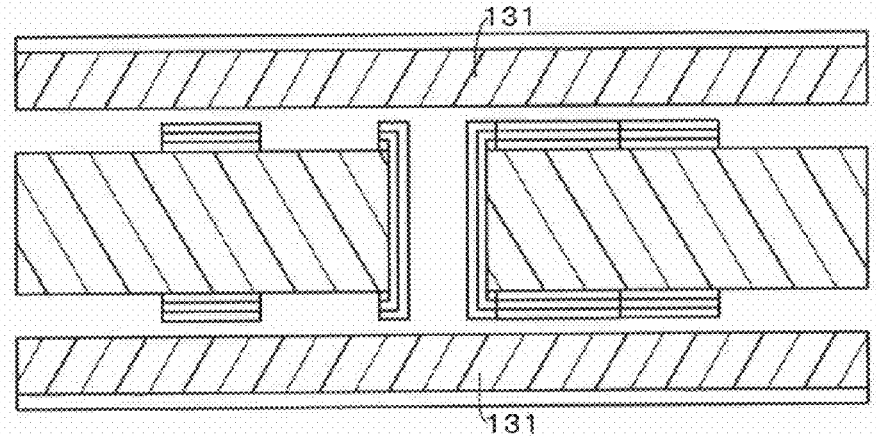

Next, as shown in FIG. 3I, low-flow prepreg 131 made of glass-epoxy resin is laminated. On one side of prepreg 131, a copper foil is arranged. As for the prepreg, for example, a commercially available "R1551" made by Matsushita Electric Works, Ltd. is used. The prepreg is prepared by impregnating glass-cloth inorganic fabric with epoxy resin, then by preliminarily thermosetting the resin to advance the level of cure. The resin to make the prepreg is preferably one with low-flow characteristics. However, resin with regular flow characteristics may be used. Also, the prepreg may be prepared by reducing the amount of epoxy-resin to be impregnated in glass-cloth inorganic fabric.

After laminating prepreg 131, pressure pressing is carried out. Pressure pressing is performed, for example, by hydraulic power using hydraulic pressing apparatus under conditions calling for temperature of 200° C., pressure of 40 kgf and pressing time of three (3) hours. By doing so, resin is squeezed out from the prepreg and the prepreg and the core material will be integrated. Also, pressure pressing may be carried out using vacuum pressing instead of hydraulic pressing. By conducting vacuum pressing, bubbles may be prevented from mixing into the resin which forms the insulation layers. Vacuum pressing is conducted, for example, for an hour. Peak temperature is set, for example, at 175° C. Vacuum pressing pressure is set, for example, at $3.90 \times 10^6$ Pa.

Figure 3J:
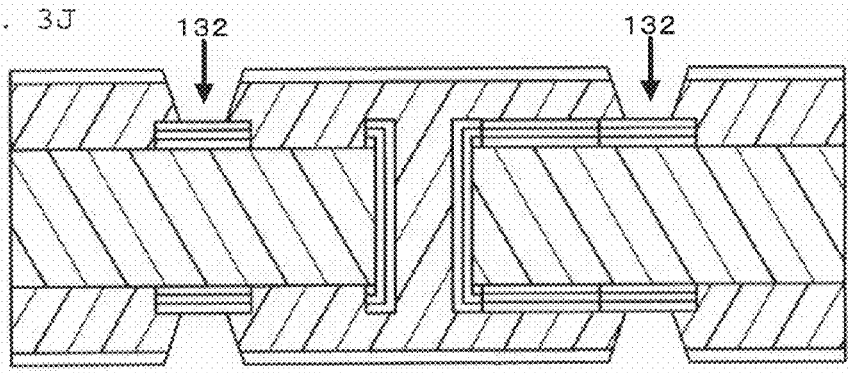

Next, referring to FIG. 3J, as shown by arrows 132, in glass-epoxy insulation resin, openings to form vias or via holes are bored. Those openings may be bored by irradiating a laser. For example, a PET film as protection film is laminated on the epoxy-resin surface, and a carbon dioxide gas laser is irradiated on the PET film from above, and openings penetrating the PET film are formed. The PET film is preferably 10 to 50 µm thick. Then, to remove the resin residue remaining on the side and bottom surfaces of the openings formed by irradiating a laser, a desmearing treatment is performed. The desmearing process is performed by a plasma-oxide discharge treatment, corona discharge treatment, ultraviolet laser treatment or excimer laser treatment. In the openings formed by irradiating a laser, conductive material is filled to form filled-vias or filled-via holes. For the conductive material, a conductive paste or metal plating formed by an electrolytic plating process is preferred. For example, vias are filled with conductor by copper plating or the like. To lower production cost and to improve productivity by simplifying the production process of filled-via holes, filling with a conductive paste is preferred. For example, a conductive paste (such as thermosetting resin containing conductive particles) may be printed by screen printing, filled in vias and cured. By filling the interior of vias with the same conductive paste material, connection reliability when thermal stress is exerted on vias may be improved. On the other hand, regarding connection reliability, metal plating formed by an electrolytic plating process is preferred. Especially electrolytic copper plating is preferred.

Figure 3K:
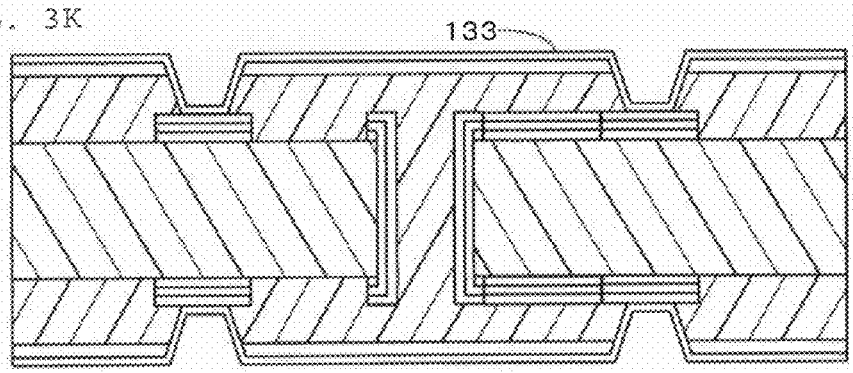

Next, as shown in FIG. 3K, electroless copper plating 133 is formed to be 0.3 μm to 3.0 μm thick. Electroless copper plating is performed at a temperature of 34° C. for 45 minutes.

Figure 3L:
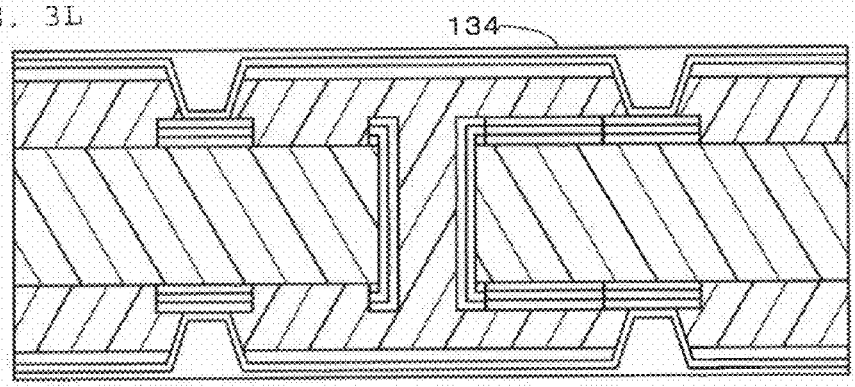

Then, as shown in FIG. 3L, electrolytic copper plating 134 is formed. An electrolytic plating solution containing sulfuric acid 2.24 mol/liter, copper sulfate 0.26 mol/liter, and additive 19.5 ml/liter, leveling agent 50 mg/liter and polishing agent 50 mg/liter is used. Conditions for electrolytic plating are current density of 1 A/dm$^2$, electrolytic plating time of approximately 70 minutes and temperature of about 22° C.

Figure 3M:
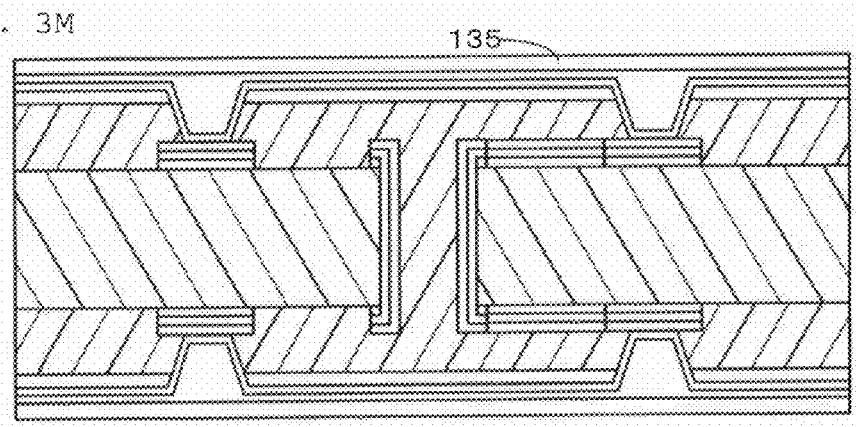

Next, as shown in FIG. 3M, mask resist 135 is laminated. For the mask resist, a commercially available dry film, for example, "H9040" made by Hitachi Chemical, is used.

Figure 3N:
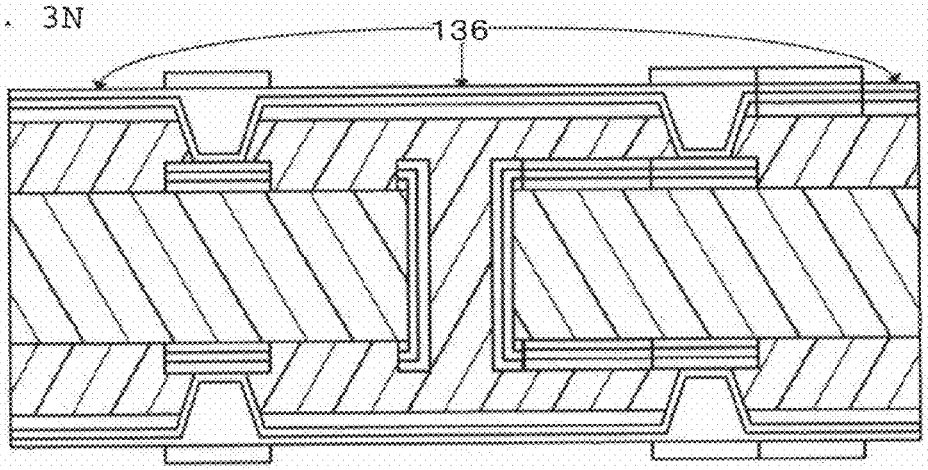

Next, as shown in FIG. 3N, at the prescribed portions indicated by arrows 136, the mask resist is exposed to light and developed using a 0.8%-sodium carbonate solution.

Figure 3O:
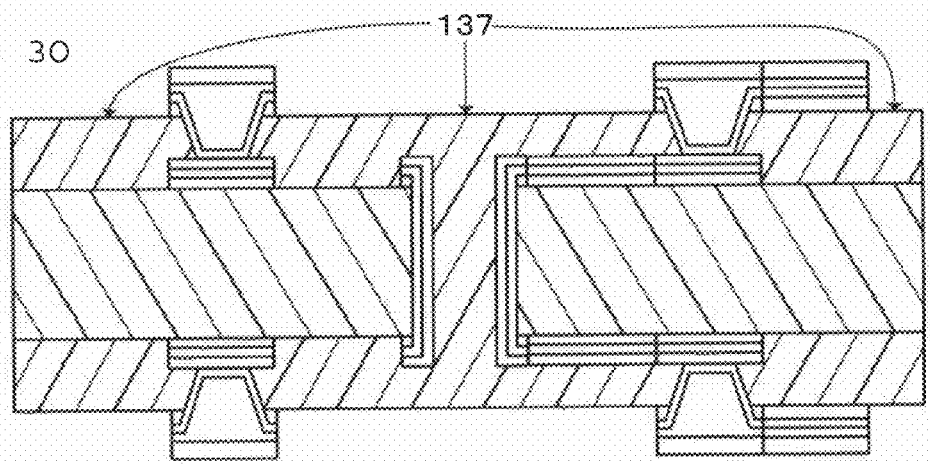

Next, as shown in FIG. 3O, the portions indicated by arrows 137 are etched using a copper (II) chloride solution.

Figure 3P:
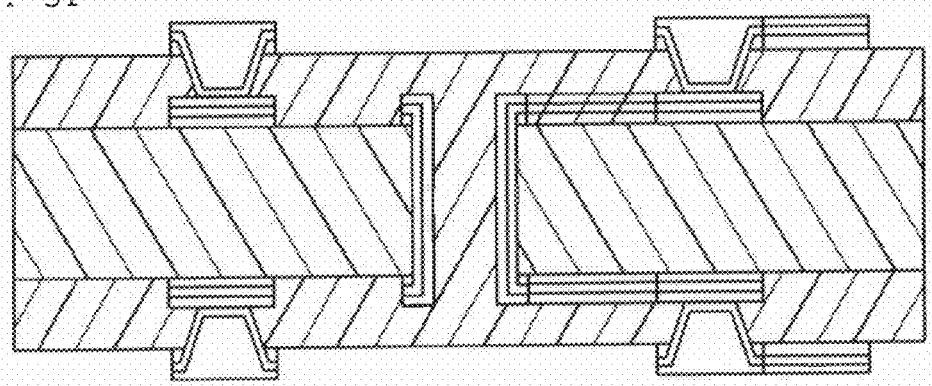

Then, as shown in FIG. 3P, the mask resist is removed using a 5%-potassium hydroxide solution.

Lastly, as shown in FIG. 3Q, electronic chips 116 are mounted on the vias through connection pads 115.

As shown in FIG. 5, in wiring board 10 according to an embodiment of the present invention, unlike the wiring board according to the first embodiment, a first lower-layer insulation layer is not formed. The rest of the structure is the same as the wiring board according to the first embodiment.

Wiring board 10 according to this embodiment of the present invention may be used when a conductive pattern is not required to be formed in the lower portion of base substrate 121. In proportion to an insulation layer which is not formed under base substrate 121 of wiring board 10, the overall thickness of the wiring board may be reduced. Therefore, for example, the wiring board may be used in an ultra-thin-type cell phone or the like.

The method of manufacturing wiring board 10 according to this embodiment is the same as that in reference to FIGS. 3A-3Q, except for the steps for laminating an insulation layer under the base substrate.

As shown in FIG. 6, wiring board 10 according to another embodiment of the present invention is different from the wiring board according to the first embodiment; on first upper-layer insulation layer (161a), second upper-layer insulation layer (161c) is laminated, and under first lower-layer insulation layer (161b), second lower-layer insulation layer (161d) is laminated. Second upper-layer insulation layer (161c) and second lower-layer insulation layer (161d) are made of glass-epoxy resin. The thickness of second upper-layer insulation layer (161c) and second lower-layer insulation layer (161d) is approximately in the range of 10 μm to 20 μm. Second upper-layer insulation layer (161c) and second lower-layer insulation layer (161d) contain a layer of glass-cloth inorganic fabric. The glass cloth is 20 μm thick and the width of the glass fiber forming the glass cloth is 5.0 μm.

On the top surface of second upper-layer insulation layer (161c) and the bottom surface of second lower-layer insulation layer (161d), conductive patterns (117c, 117d) are formed respectively.

In second upper-layer insulation layer (161c), vias (114c) are formed, and in second lower-layer insulation layer (161d), vias (114d) are formed. On vias (114c), through connection pads (115c), electronic chips (116c) are mounted. Conductive pattern (117c) and conductive pattern (113a) are electrically connected through stacked vias (114a, 114c). Conductive pattern (117d) and conductive pattern (113b) are electrically connected through stacked vias (114b, 114d).

Through stacked vias (114a, 114c) and stacked vias (114b, 114d), the wiring length is made shorter, and thus a wiring board that is suitable for mounting electronic components which require large amounts of electricity may be provided.

The interiors of vias (114c, 114d) are filled with plating metals. The plating metal is copper. The via-diameter of vias (114c, 114d) is in the range of 10 μm to 50 μm, more preferably in the range of 20 μm to 40 μm.

The method of manufacturing wiring board 10 according to this embodiment is the same manufacturing method as in the first embodiment in reference to FIGS. 3A-3Q.

Figure 7A:
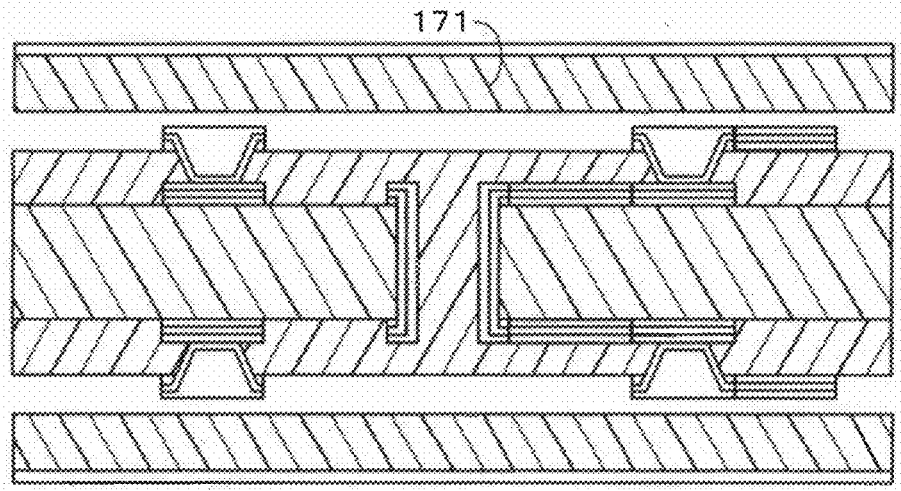
FIGS. 7A to 7I are illustrations of steps showing a method to manufacture a wiring board according to an embodiment of the present invention.

And, following FIG. 3Q, as shown in FIG. 7A, low-flow prepreg 171 made of glass-epoxy resin is laminated. On one surface of prepreg 171, a copper foil is provided. A commercially available prepreg, for example, "R1551" made by Matsushita Electric Works, Ltd., may be used. After prepreg 171 is laminated, pressure pressing is carried out.

Figure 7B:
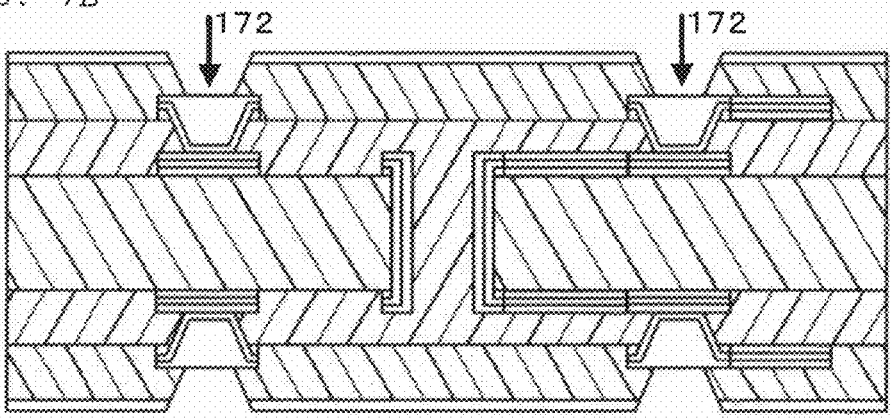

Next, as shown by arrows 172 in FIG. 7B, in glass-epoxy insulation resin, openings for forming via-holes are made. Those openings may be made by irradiating a laser.

Figure 7C:
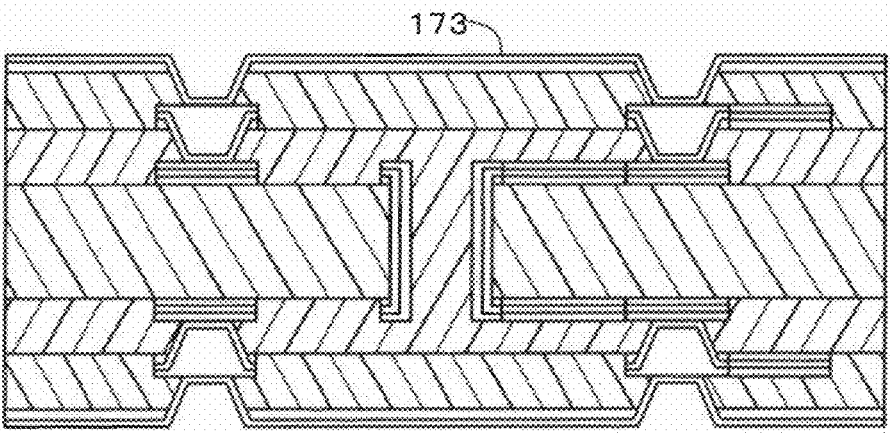

Next, as shown in FIG. 7C, electroless copper plating 173 with a thickness in the range of 0.3 μm to 3.0 μm is performed.

Figure 7D:
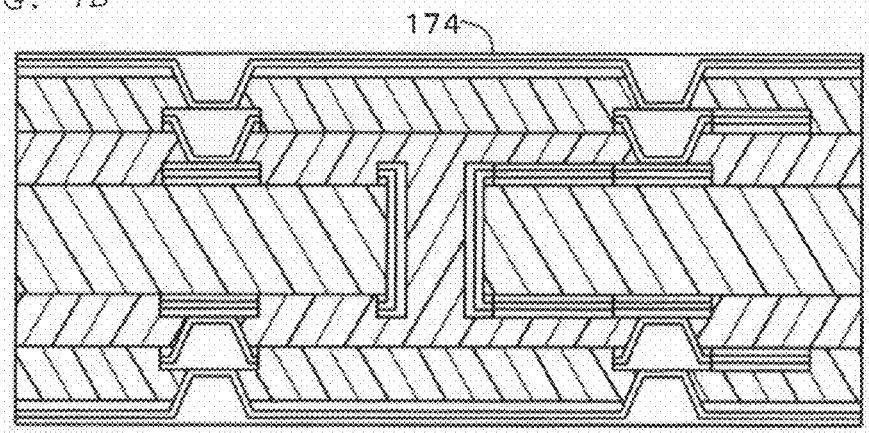

Next, as shown in FIG. 7D, electrolytic copper plating 174 is performed.

Figure 7E:
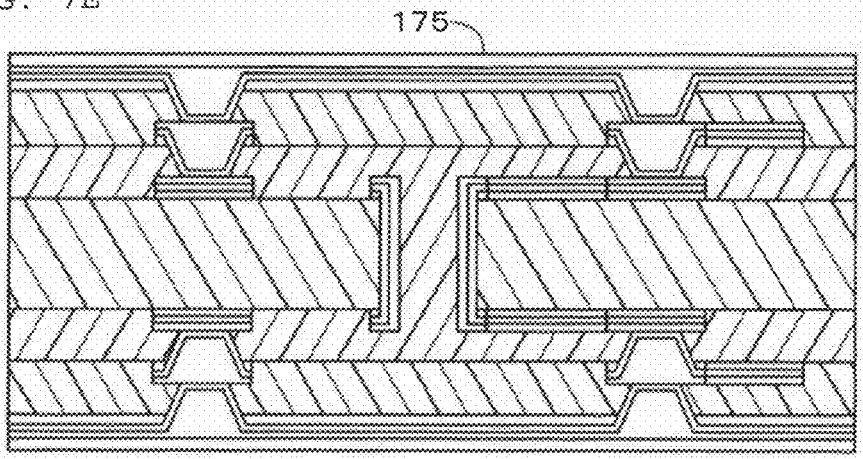

Next, as shown in FIG. 7E, mask resist 175 is laminated.

Figure 7F:
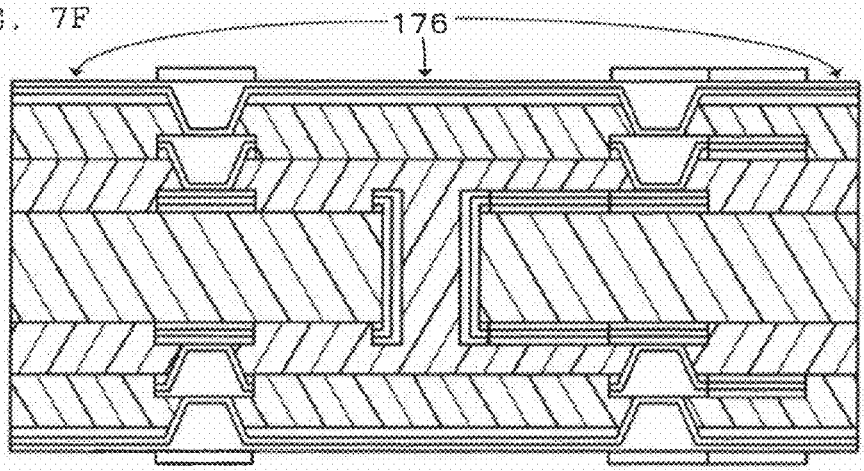

Next, as shown in FIG. 7F, at the predetermined portions indicated by arrows 176, the mask resist is exposed to light and developed.

Figure 7G:
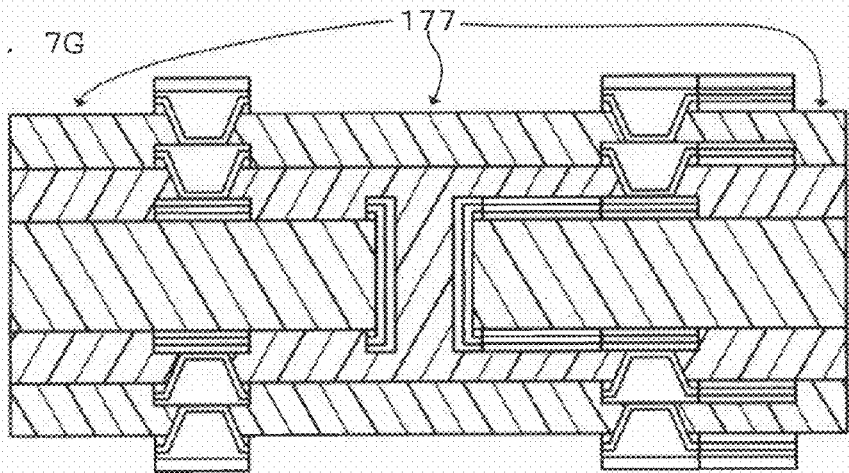

Next, as shown in FIG. 7G, at the predetermined portions indicated by arrows 177, etching is conducted.

Figure 7H:
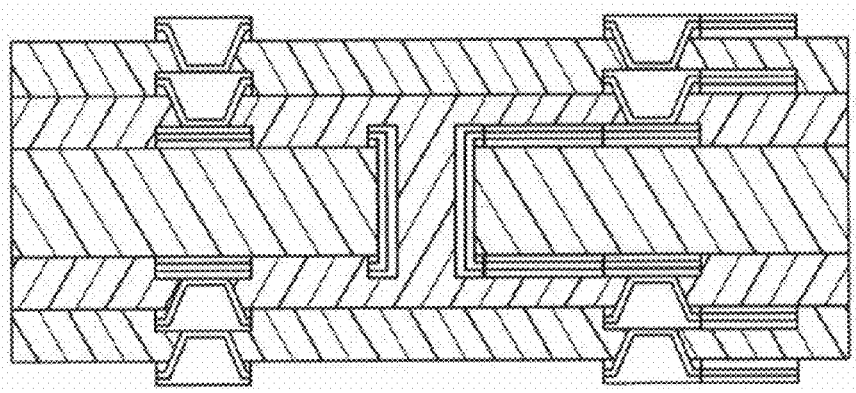

And, as shown in FIG. 7H, the mask resist is removed.

Figure 7I:
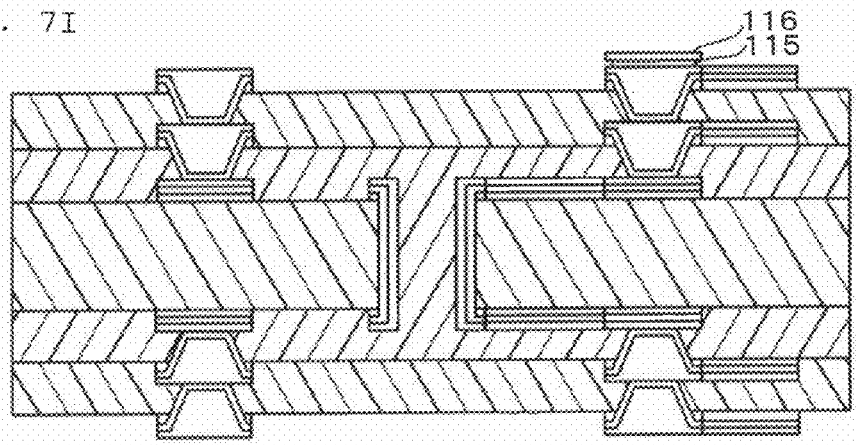

Lastly, as shown in FIG. 7I, electronic chip 116 is mounted on the via through connection pad 115.

Also, in the first embodiment, insulation layers are formed with glass epoxy resin. However, the material is not limited to such. As for base material of resin-impregnated glass cloth, base material such as bismaleimide-triazine resin-impregnated glass cloth, polyphenylene ether resin-impregnated glass cloth, epoxy resin-impregnated aramide non-woven fabric, or polyimide-impregnated aramide non-woven fabric may also be used.

Also, if glass epoxy resin is used, as for the epoxy resin, naphthalene-type epoxy resin, dicyclo-pentadiene-type epoxy resin, biphenyl-type epoxy resin, bisphenole-A-type epoxy resin, bisphenol-F-type epoxy resin, bisphenol-S-type epoxy resin, phenol novolac-type epoxy resin, alkylphenol novolac-type epoxy resin, aralkyl-type epoxy resin, biphenol-type epoxy resin, anthracene-type epoxy resin, epoxy-dated condensation of a phenolic group and aromatic compound aldehyde containing a phenolic hydroxyl group, triglycidyl isocyanurate, or alicyclic epoxy resin may be used.

Also, in the first embodiment, the thickness of the glass cloth is 20 μm and the width of the glass fiber forming the glass cloth is 5.0 μm. However, glass cloth is not limited to such. Glass cloth having a thickness of 30 μm or less, with the diameter of its glass fiber in the range of 1.5 to 7.0 μm thick may be selected. If the thickness of glass cloth exceeds 30 μm, the thickness of insulation layers becomes too large, and if the width of the glass fiber is less than 1.5 μm, the rigidity of insulation layers is not sufficient. If it exceeds 7.0 μm, it is difficult to ease impact intensity at insulation layers.

Also, in the first embodiment, for the inorganic fabric contained in insulation layers, glass cloth is used. However, it is not limited to such. As for inorganic fabric, for example, alumina fabric, carbon fabric (carbon fiber), silicon carbide fabric or silicon nitride fabric may be used.

Also, in the first embodiment, base substrate 121 is formed using glass epoxy resin. However, it is not limited to such. For base substrate 121, resin made of polycarbonate, denaturated polyphenylene ether, polyphenylene oxide, polybutylene-telephtalate, polyacrylate, polysulfone, polyphenylene-sulfide, polyether-etherketone, tetrafluoroethylene, bismaleimide, polysulfone, polyethersulfone, polyphenylsulfone, polyphthalamide, polyamide-imide, polyketone or polyacetal may be used.

A wiring board according to an embodiment of an embodiment of the present invention has an insulation layer formed with a base material of resin-impregnated inorganic cloth; a base substrate that supports the insulation layer; vias that electrically connect a conductive pattern formed on the insulation layer and a conductive pattern formed on the base substrate; and a through-hole that penetrates the base substrate and has a hole-diameter in the range of 10 µm to 150 µm.

Also, a wiring board according to another embodiment of the present invention has a first upper-layer insulation layer formed with a base material of resin-impregnated inorganic cloth; a first lower-layer insulation layer formed with a base material of resin-impregnated inorganic cloth; a base substrate that supports the first upper-layer insulation layer and the first lower-layer insulation layer; vias that electrically connect the conductive pattern formed on the first upper-layer insulation layer and the conductive pattern formed on the base substrate; vias that electrically connect the conductive pattern formed beneath the first lower-layer insulation layer and the conductive pattern formed beneath the base substrate; and a through-hole which penetrates the base substrate and has a hole-diameter in the range of 10 µm to 150 µm.

Also, a method of manufacturing the wiring board according to yet another embodiment of the present invention is: in a base substrate having a conductive pattern on the surface, to form a through-hole with a hole-diameter in the range of 10 µm to 150 µm; on the base substrate, to laminate an insulation layer which is formed with a base material of resin-impregnated inorganic cloth and has a conductive pattern on the surface; and in the insulation layer, to form vias that electrically connect the conductive pattern formed on the surface of the insulation layer and the conductive pattern formed on the surface of the base substrate.

Also, a method of manufacturing the wiring board according to still another embodiment of the present invention is: in a base substrate having a conductive pattern on the surface, to form a through-hole with a hole-diameter in the range of 10 µm to 150 µm; on each of the upper and lower surfaces of the base substrate, to laminate an upper-layer insulation layer and a lower-layer insulation layer that are formed with a base substrate of resin-impregnated inorganic cloth and have a conductive pattern on the surface; in the upper-layer insulation layer, to form vias that electrically connect the conductive pattern formed on the upper-layer insulation layer and the conductive pattern formed on the base substrate; and in the lower-layer insulation layer, to form vias that electrically connect the conductive pattern formed beneath the lower-layer insulation layer and the conductive pattern formed beneath the base substrate.

According to the foregoing embodiments of the present invention, while an electronic device is in use for a long duration, if electrical continuity inside a through-hole has generated high temperatures, the risk of rupture in the connection between conductive patterns may be minimized.

The embodiments of the present invention may be used in a wiring board that can mount electronic components, specifically in a wiring board that can mount electronic components to be used in a compact electronic device.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A wiring board comprising:
    a base substrate;
    a conductive pattern formed on the base substrate;
    an insulation layer formed on the conductive pattern and the base substrate and comprising a resin-impregnated inorganic cloth;
    a conductive pattern formed on the insulating layer;
    a via formed in the insulation layer and connecting the conductive pattern formed on the base substrate and the conductive pattern formed on the insulating layer; and
    a through-hole comprising a plating film and a resin filling an interior space surrounded by the plating film of the through-hole, the plating film of the through-hole being connected to the conductive pattern formed on the base substrate,
    wherein the through-hole is penetrating through the base substrate and covered with the insulation layer, and the through-hole has an aspect ratio in a range of 2 to 5 and a hole diameter in a range of 10 µm to 150 µm.

2. The wiring board according to claim 1, wherein the via is filled with a plating metal.

3. The wiring board according to claim 1, wherein the via is filled with a resin.

4. The wiring board according to claim 1, wherein the via has a via-diameter in a range of 10 µm to 50 µm.

5. The wiring board according to claim 1, wherein the resin-impregnated inorganic cloth comprises a glass cloth.

6. The wiring board according to claim 5, wherein the glass cloth in the insulation layer is a single layer.

7. The wiring board according to claim 1, further comprising a conductive pattern formed on an opposite surface of the base substrate, wherein the through-hole connects the conductive pattern formed on the surface of the base substrate and the conductive pattern formed on the opposite surface of the base substrate.

8. The wiring board according to claim 1, wherein the base substrate comprises a resin comprising a glass epoxy resin.

9. A wiring board comprising:
    a base substrate having a conductive pattern formed on an upper surface of the base substrate and a conductive pattern formed on a lower surface of the base substrate;
    a first upper-layer insulation layer formed on the upper surface of the base substrate and the conductive pattern formed on the upper surface of the base substrate, the first upper-layer insulation layer having a conductive pattern formed thereon and comprising a resin-impregnated inorganic cloth;
    a first lower-layer insulation layer formed on the lower surface of the base substrate and the conductive pattern formed on the lower surface of the base substrate, the first lower-layer insulation layer having a conductive pattern formed thereon and comprising a resin-impregnated inorganic cloth;
    a via formed in the first upper-layer insulation layer and connecting the conductive pattern formed on the upper surface of the base substrate and the conductive pattern formed on the first upper-layer insulation layer;

a via formed in the first lower-layer insulation layer and connecting the conductive pattern formed on the lower surface of the base substrate and the conductive pattern formed underneath the first lower-layer insulation layer; and a through-hole comprising a plating film and a resin filling an interior space surrounded by the plating film of the through-hole, the plating film of the through-hole being connected to the conductive pattern formed on the upper surface of the base substrate and the conductive pattern formed on the lower surface of the base substrate, wherein through-hole is penetrating through the base substrate and covered with the insulation layer, and the through-hole has an aspect ratio in a range of 2 to 5 and a hole-diameter in a range of 10 µm to 150µm.

10. The wiring board according to claim 9, wherein the vias in the first upper-layer insulation layer and the first lower-layer insulation layer are filled with a plating metal.

11. The wiring board according to claim 9, wherein the vias in the first upper-layer insulation layer and the first lower-layer insulation layer have a via-diameter in a range of 10 µm to 50 µm.

12. The wiring board according to claim 9, wherein the resin-impregnated inorganic cloth comprises a glass cloth.

13. The wiring board according to claim 12, wherein the glass cloth in the upper-layer insulation layer and glass cloth in the lower-layer insulation layer are single layers, respectively.

14. The wiring board according to claim 9, further comprising:
a second upper-layer insulation layer formed on the first upper-layer insulation layer;
a second lower-layer insulation layer formed under the first lower-layer insulation layer;
a via formed in the second upper-layer insulation layer; and
a via formed in the second lower-layer insulation layer.

15. The wiring board according to claim 14, further comprising a conductive pattern formed on the second upper-layer insulation layer and a conductive pattern formed underneath the second lower-layer insulation layer, wherein the vias formed in the first upper-layer insulation layer and the second upper-layer insulation layer comprise stacked vias, the conductive patterns formed on the second upper-layer insulation layer and the upper surface of the base substrate are connected through the stacked vias comprising the vias formed in the first upper-layer insulation layer and the second upper-layer insulation layer, the vias formed in the first lower-layer insulation layer and the second lower-layer insulation layer comprise stacked vias, the conductive patterns formed underneath the second lower-layer insulation layer and the lower surface of the base substrate are connected through the stacked vias comprising the vias formed in the first lower-layer insulation layer and the second lower-layer insulation layer.

16. A method of manufacturing a wiring board, comprising:
providing in a base substrate having a conductive pattern on a surface of the base substrate;
forming a through-hole comprising a plating film and penetrating through the base substrate such that the plating film of the through-hole is connected to the conductive pattern on the surface of the base substrate and has an aspect ratio in a range of 2 to 5 and a hole-diameter in a range of 10 µm to 150 µm;
laminating on the base substrate an insulation layer comprising a resin-impregnated inorganic cloth such that a resin of the insulation layer fills an interior space surrounded by the plating film of the through-hole;
forming a conductive pattern on a surface of the insulation layer; and
forming in the insulation layer a via connecting the conductive pattern formed on the surface of the insulation layer and the conductive pattern formed on the surface of the base substrate.

17. The method of manufacturing a wiring board according to claim 16, wherein the via is filled with a plating metal.

18. The method of manufacturing a wiring board according to claim 16, wherein the via is filled with a resin.

19. The method of manufacturing a wiring board according to claim 16, wherein the forming of the via comprising forming a via having a via-diameter in a range of 10 µm to 50 µm.

20. The method of manufacturing a wiring board according to claim 16, wherein the resin-impregnated inorganic cloth comprises a glass cloth.

21. The method of manufacturing a wiring board according to claim 20, wherein the glass cloth in the insulation layer is one layer.

22. The method of manufacturing a wiring board according to claim 16, wherein the base substrate has a conductive pattern formed underneath the base substrate and the through-hole connects the conductive pattern formed on the base substrate and the conductive pattern formed underneath the base substrate.

23. The method of manufacturing a wiring board according to claim 16, wherein the base substrate comprise a resin comprising a glass epoxy resin.

24. A method of manufacturing a wiring board, comprising:
providing a base substrate having a conductive pattern on an upper surface of the base substrate and a conductive pattern on a lower surface of the base substrate;
forming a through-hole comprising a plating film and penetrating through the base substrate such that the plating film of the through-hole is connected to the conductive pattern on the upper surface of the base substrate and the conductive pattern on the lower surface of the base substrate and has an aspect ratio in a range of 2 to 5 and a hole-diameter in a range of 10 µm to 150 µm;
laminating on the upper surface of the base substrate a first upper-layer insulation layer comprising a resin-impregnated inorganic cloth;
forming a conductive pattern on a surface of the first insulation layer;
laminating on the lower surface of the base substrate a first lower-layer insulation layer comprising a resin-impregnated inorganic cloth;
forming a conductive pattern on a surface of the first lower-layer insulation layer;
forming in the first upper-layer insulation layer a via connecting the conductive pattern formed on the first upper-layer insulation layer and the conductive pattern formed on the uuper surface of the base substrate; and
forming in the first lower-layer insulation layer a via connecting the conductive pattern formed underneath the first lower-layer insulation layer and the conductive pattern formed on the lower surface of the base substrate,
wherein at least one of the laminating of the first upper-layer insulation layer and the laminating of the first lower-layer insulation layer comprises filling a resin into an interior space surrounded by the plating film of the through-hole.

25. The method of manufacturing a wiring board according to claim 24, wherein the vias in the first upper-layer insulation layer and the first lower-layer insulation layer are filled with a plating metal.

26. The method of manufacturing a wiring board according to claim 24, wherein the vias in the first upper-layer insulation layer and the first lower-layer insulation layer have a via-diameter in a range of 10 µm to 50 µm.

27. The method of manufacturing a wiring board according to claim 24, wherein the resin-impregnated inorganic cloth comprises a glass cloth.

28. The method of manufacturing a wiring board according to claim 27, wherein the glass cloth in the upper-layer insulation layer and the glass cloth in the lower-layer insulation layer are single layers, respectively.

29. The method of manufacturing a wiring board according to claim 28, further comprising:
- laminating a second upper-layer insulation layer on the upper-layer insulation layer;
- laminating a second lower-layer insulation layer under the first lower-layer insulation layer;
- forming a via in the second upper-layer insulation layer; and
- forming a via in the second lower-layer insulation layer.

* * * * *